(12) United States Patent
Beyer et al.

(10) Patent No.: US 8,951,901 B2
(45) Date of Patent: Feb. 10, 2015

(54) SUPERIOR INTEGRITY OF A HIGH-K GATE STACK BY FORMING A CONTROLLED UNDERCUT ON THE BASIS OF A WET CHEMISTRY

(75) Inventors: Sven Beyer, Dresden (DE); Berthold Reimer, Dresden (DE); Falk Graetsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 789 days.

(21) Appl. No.: 13/188,745

(22) Filed: Jul. 22, 2011

(65) Prior Publication Data

US 2012/0086056 A1 Apr. 12, 2012

(30) Foreign Application Priority Data

Oct. 8, 2010 (DE) .......................... 10 2010 042 229

(51) Int. Cl.
*H01L 21/3205* (2006.01)
*H01L 21/4763* (2006.01)
(Continued)

(52) U.S. Cl.
CPC .... *H01L 21/28114* (2013.01); *H01L 21/31111* (2013.01); *H01L 21/32134* (2013.01); *H01L 21/32139* (2013.01); *H01L 29/42376* (2013.01); *H01L 29/7833* (2013.01); *H01L 29/51* (2013.01); *H01L 29/513* (2013.01)
USPC ........... 438/585; 257/288; 257/306; 257/310; 257/366; 257/369; 257/412; 257/E29.027; 257/E21.017; 257/E21.019; 257/E21.021; 257/E21.495; 257/E21.635; 438/152; 438/167; 438/182; 438/197; 438/592; 438/595; 438/745; 438/749; 438/750; 438/754

(58) Field of Classification Search
CPC ............... H01L 21/31111; H01L 2924/13091; H01L 29/12; H01L 29/513; H01L 21/823842; H01L 21/31133; H01L 21/823828; H01L 21/8249; H01L 29/66477; H01L 29/78
USPC ......... 438/152, 167, 182, 197, 585, 592, 595, 438/745, 754; 257/288, 306, 310, 368, 369, 257/412, E29.027, E21.017, 257/E21.019–E21.021, E21.495, E21.623, 257/E21.624, E21.635
See application file for complete search history.

(56) References Cited

U.S. PATENT DOCUMENTS 5,834,817 A * 11/1998 Satoh et al. ................... 257/387
5,882,968 A * 3/1999 Jun ............................... 438/254
(Continued)

FOREIGN PATENT DOCUMENTS

DE 102009023298 A1 12/2010 ............ H01L 21/336

OTHER PUBLICATIONS

Translation of Official Communication from German Patent Office for German Patent Application No. 10 2010 042 229.0 dated Jun. 22, 2011.

*Primary Examiner* — Meiya Li
(74) *Attorney, Agent, or Firm* — Amerson Law Firm, PLLC (57) ABSTRACT

In sophisticated semiconductor devices, the encapsulation of sensitive gate materials, such as a high-k dielectric material and a metal-containing electrode material, which are provided in an early manufacturing stage may be achieved by forming an undercut gate configuration. To this end, a wet chemical etch sequence is applied after the basic patterning of the gate layer sequence, wherein at least ozone-based and hydrofluoric acid-based process steps are performed in an alternating manner, thereby achieving a substantially self-limiting removal behavior.

18 Claims, 5 Drawing Sheets

(51) Int. Cl.
*H01L 21/28* (2006.01)
*H01L 21/311* (2006.01)
*H01L 21/3213* (2006.01)
*H01L 29/423* (2006.01)
*H01L 29/78* (2006.01)
*H01L 29/51* (2006.01)

(56) References Cited

U.S. PATENT DOCUMENTS

| | | | | |
|---|---|---|---|---|
| 5,994,234 A | * | 11/1999 | Ouchi | 438/719 |
| 6,331,478 B1 | * | 12/2001 | Lee et al. | 438/592 |
| 6,475,841 B1 | * | 11/2002 | Taylor et al. | 438/197 |
| 6,551,913 B1 | * | 4/2003 | Kim et al. | 438/592 |
| 6,953,744 B2 | * | 10/2005 | Kim et al. | 438/637 |
| 7,105,430 B2 | * | 9/2006 | Orlowski et al. | 438/592 |
| 2002/0163039 A1 | * | 11/2002 | Clevenger et al. | 257/340 |
| 2002/0175381 A1 | * | 11/2002 | Choi et al. | 257/369 |
| 2003/0042517 A1 | * | 3/2003 | Stottko et al. | 257/288 |
| 2003/0129793 A1 | * | 7/2003 | Chau et al. | 438/200 |
| 2003/0201505 A1 | * | 10/2003 | Kurata | 257/412 |
| 2004/0092075 A1 | * | 5/2004 | Yeo et al. | 438/305 |
| 2007/0040223 A1 | * | 2/2007 | Datta et al. | 257/368 |
| 2008/0224238 A1 | * | 9/2008 | Kanakasabapathy et al. | 257/411 |
| 2009/0258475 A1 | * | 10/2009 | Endo et al. | 438/459 |
| 2010/0062590 A1 | * | 3/2010 | Lin et al. | 438/585 |
| 2010/0297840 A1 | * | 11/2010 | Kim et al. | 438/592 |
| 2010/0301421 A1 | | 12/2010 | Kronholz et al. | 257/369 |
| 2012/0295431 A1 | * | 11/2012 | Foster et al. | 438/585 |

* cited by examiner

SUPERIOR INTEGRITY OF A HIGH-K GATE STACK BY FORMING A CONTROLLED UNDERCUT ON THE BASIS OF A WET CHEMISTRY

BACKGROUND OF THE INVENTION

1. Field of the Invention

Generally, the present disclosure relates to the fabrication of sophisticated integrated circuits including advanced transistor elements that comprise gate structures of increased capacitance including a high-k gate dielectric and a metal-containing cap layer.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of integrated circuits, field effect transistors represent one important type of circuit element that substantially determines performance of the integrated circuits. Generally, a plurality of process technologies are currently practiced for forming field effect transistors, wherein, for many types of complex circuitry, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations to be fabricated by using volume production techniques. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon, from the silicon channel region. In steadily improving device performance of field effect transistors, the length of the channel region has been continuously decreased to improve switching speed and drive current capability. Since transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, since the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. The relatively high leakage current caused by direct tunneling of charge carriers through an ultra-thin silicon dioxide-based gate insulation layer may reach values for an oxide thickness in the range of 1-2 nm that may not be compatible with requirements for many types of circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be enhanced by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same thickness as a silicon dioxide layer, while, additionally, leakage currents are kept at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination with the metal-containing electrode material. It is believed that the deterioration of the high-k metal gate is substantially caused by the incorporation of oxygen and a respective oxygen diffusion within the high-k dielectric material, wherein the oxygen diffusion may be fed by oxygen contained in the ambient that may come into contact with the high-k dielectric during the processing of the devices. Since, for instance, hafnium- and zirconium-based oxides grow very fast due to the high affinity to oxygen and its diffusion even at moderate temperatures, a significant modification of the characteristics of the high-k dielectric material may be observed, for instance an increased layer thickness and thus a reduced dielectric constant, which may be even further pronounced at moderately high temperatures of approximately 950-1300° C., as may typically be used during activation treatments and the like.

In addition to a significant modification of the high-k dielectric material, also the work function of the metal-containing electrode in the gate stack may be shifted towards the center of the band gap, thereby modifying the threshold voltage of respective transistors. Due to the high oxygen affinity of the high-k dielectric material and due to the exposure to wet chemical etch procedures and cleaning processes, usually the gate stack is encapsulated after the patterning process in order to enhance stability of the high-k dielectric material and the respective metals in the gate stack. For this purpose, silicon nitride has proven to be a promising material due to its oxygen blocking characteristics. Hence, in typical conventional process flows, a silicon nitride liner with a thickness in the range of approximately 1-5 nm may be formed on exposed surface areas of the patterned high-k gate stack, wherein appropriate deposition techniques are used so as to not unduly affect device characteristics and/or the subsequent manufacturing steps. For example, well-established low pressure chemical vapor deposition (LPCVD) techniques and/or multi-layer deposition techniques may be applied for forming the silicon nitride liner.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge carrier mobility, and thus the overall conductivity of the channel, may be enhanced.

Many of these strain-inducing mechanisms are based on a strained or stress-inducing material that is formed in close proximity to the channel region of the transistor under consideration. For example, frequently, a strain-inducing semiconductor material is embedded into the drain and source areas, while, in other cases, in addition or alternatively to this mechanism, a highly stressed dielectric material is formed above the gate electrode structure and the transistor, thereby also efficiently transferring strain into the channel region. Generally, upon further scaling the transistor dimensions, the strain transfer efficiency may significantly depend on the lateral distance of any strain-inducing materials, which in turn may require a corresponding scaling of the lateral offset, thereby also requiring a reduction of the thickness of any spacer structures and the like, which may also include the protective liner material formed on sidewalls of the complex gate electrode structures. Also with respect to other aspects, such as complex lateral dopant profiles of the drain and source regions, a reduced thickness of the protective liner material may be highly desirable. Consequently, the liner material intended for enhancing integrity of the sensitive gate electrode structure during the further processing for completing the transistor configuration may be reduced in thickness, which, however, may result in severe yield losses due to material loss in the gate electrode structure. Without intending to restrict the present application to any theory, it is nevertheless believed that patterning irregularities, in particular at the foot of the complex gate electrode structure, may result in inferior coverage of this area when selecting an appropriate thickness for the liner material. That is, upon patterning the complex gate layer stack, which may, in conventional approaches, result in a certain tapered cross-sectional shape of the gate electrode structure at the foot thereof, for instance in view of enabling superior process control on the basis of electron microscopy for adjusting the electrically effective gate length, a reduced degree of coverage by the liner material may thus increase the probability of an interaction with aggressive chemical agents during the further processing of the semiconductor device. For example, an SPM (sulfuric acid hydrogen peroxide mixture) is a very efficient cleaning agent in order to remove any contaminants, metal residues and the like after performing the complex patterning process and prior to performing any further critical processes. Omitting a cleaning step in this manufacturing stage or providing a less efficient cleaning recipe may significantly increase overall defectivity, which may thus result in a significant yield loss at this manufacturing stage. On the other hand, the reduced degree of coverage at the foot of the gate electrode structures may contribute to an increased probability of removing significant amounts of the metal-containing electrode material, such as the titanium nitride, which may thus result in a significant variability of the resulting transistor characteristics, since, for instance, the electrically effective gate length may be influenced by a loss of titanium nitride material, thereby causing variations of the threshold voltage and the like. For example, pronounced transistor variability has been observed across individual dies and also across substrates, thereby contributing to increased yield loss or to an increased amount of semiconductor devices of reduced performance.

Therefore, it has been proposed to form a defined undercut below the polysilicon material, that is, to remove a portion of the sensitive titanium nitride, high-k and any base oxide material in order to achieve a superior encapsulation, in particular of the undercut area, when forming the silicon nitride liner material. To this end, in some conventional approaches, a diluted SPM agent is applied prior to actually forming the liner material, thereby creating a desired undercut area. It turns out, however, that the degree of under etching upon applying the diluted SPM solution critically depends on the process conditions, in particular on the concentration of the solution, which may result in a substantially non-controllable lateral etch rate so that also significant transistor variability may be observed, although the subsequent encapsulation of the gate electrode structure may provide superior coverage at the undercut area. In other conventional approaches, a reactive ion etch process which is applied in order to pattern the complex gate layer stack may typically have a certain lateral etch rate and may also be used upon appropriately selecting the etch chemistry in a final phase of the etch sequence so as to form an undercut area. Generally, the reduced lateral etch rate compared to the wet chemical process performed on the basis of diluted SPM may generally provide superior controllability, wherein, however, even any subtle modifications of the gate layer stack may also result in significantly different etch results upon forming the undercut area. Moreover, generally, the polysilicon profile may also be affected, thereby resulting in a degraded overall gate profile.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the encapsulation of sophisticated gate electrode structures may be enhanced by forming an undercut area at the bottom of the gate electrode structures in a highly controllable manner by using an etch chemistry in which hydrofluoric acid and ozone may be applied in an alternating manner. It has been recognized that a substantially self-limiting etch behavior, or at least a highly controllable and thus predictable etch behavior, may be achieved on the basis of a plurality of alternating process steps performed on the basis of ozone and hydrofluoric acid, respectively. In this manner, preferably material of the sensitive components of a sophisticated gate electrode structure, such as a high-k dielectric material and a metal-containing electrode material, may be removed in a very controllable manner so as to provide an undercut area, which in turn may result in superior process conditions upon forming a protective liner material, such as a silicon nitride material and the like. The highly controllable under etching of the semiconductor-based electrode material, provided, for instance, in the form of amorphous or polycrystalline silicon, enables a precise control of the electrically effective gate length on the basis of well-established plasma assisted etch recipes, on the basis of which a desired basic gate length may be adjusted prior to applying the well-controllable etch process sequence including the alternating ozone-based and hydrofluoric acid-based process steps. At the same time, the undercut configuration results in superior integrity of, in particular, the metal-containing electrode material during the further processing, which may thus be based on efficient cleaning recipes, for instance using SPM and the like. In other cases, the final etch sequence including the alternating ozone-based and hydrofluoric acid-based process steps may be applied in the form of a cleaning process, thereby even further enhancing efficiency in removing any unwanted residues of the preceding patterning process. Moreover, compared to some conventional approaches, in particular any increase in gate length at the foot of complex gate electrode structures may be efficiently avoided by using the final etch sequence, which may thus generally provide superior uniformity of the finally obtained transistor characteristics and which may also contribute to superior confinement of the sensitive gate materials. Due to the highly controllable under etching of sophisticated gate electrode structures, superior uniformity of transistor characteristics, for instance in terms of threshold voltage and the like, may be achieved across single semiconductor die regions and also across entire semiconductor substrates since the final under etch process sequence disclosed herein may not critically depend on minor variations of process parameters, such as process time, concentration of reagents and the like. Therefore, the undercut area may provide a substantially uniform electrically effective gate length, wherein the superior confinement after depositing the protective liner material may thus efficiently "preserve" the previously adjusted transistor characteristics during the further processing, thereby significantly reducing any non-uniformities, which may conventionally be observed due to any interaction of the sensitive gate materials with reactive process atmospheres that are typically encountered during the further processing of the semiconductor device.

One illustrative method disclosed herein relates to forming a gate electrode structure of a semiconductor device. The method comprises performing a first etch sequence so as to pattern a gate layer stack formed above a substrate, wherein the gate layer stack comprises a gate dielectric layer including a high-k dielectric material, a metal-containing electrode material formed above the gate dielectric layer and a semiconductor material formed above the metal-containing electrode material. The method further comprises performing a second etch sequence so as to perform an undercut area in the patterned gate layer stack below the semiconductor material, wherein the second etch sequence comprises a first etch step and a second etch step based on hydrofluoric acid and at least one process step based on ozone that is performed between the first and second etch steps. The method further comprises forming a protective liner on exposed surface areas of at least the undercut area.

A further illustrative method disclosed herein comprises forming a gate electrode structure on a semiconductor region of a semiconductor device, wherein the gate electrode structure comprises a semiconductor material and a gate insulation layer that is formed below the semiconductor material and that comprises a high-k dielectric material. The method further comprises reducing a length of the gate insulation layer relative to the semiconductor material by performing a wet chemical process sequence, which comprises a plurality of first process steps performed on the basis of hydrofluoric acid and a plurality of second process steps performed on the basis of ozone, wherein each of the plurality of first process steps is preceded by one of the plurality of second process steps.

One illustrative transistor device disclosed herein comprises a gate electrode structure that comprises a high-k gate insulation layer, a metal-containing first electrode material formed above the high-k gate insulation layer and a second electrode material formed above the metal-containing first electrode material. The high-k gate insulation layer has a length that is less than a length of the second electrode material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which superior encapsulation and, thus, reduced transistor variabilities may be achieved for devices including sophisticated high-k metal gate electrode structures by forming an undercut area in a highly controllable manner on the basis of a plurality of individual etch steps using hydrofluoric acid in combination with a plurality of process steps performed on the basis of ozone, wherein these process steps may be applied in an alternating manner. It has been recognized that an alternating application of an ozone-based process step and a hydrofluoric acid-based process step, preferably in combination with an intermediate rinse process based on water, may result, in addition to a desired removal of any contaminants, in a highly controlled and thus substantially self-limiting removal of sensitive gate materials, in particular of a metal-containing electrode material, such as a titanium nitride material, thereby forming a predictable undercut area below the semiconductor-based electrode material of the gate electrode structure. The alternating application of an ozone-based solution and a hydrofluoric acid solution with appropriate separation between these steps, for instance by an appropriate water rinse step, provides a substantially constant removal rate without a significant dependence on the process time of the individual process steps and a certain variability of other process parameters, such as the concentration of the various chemical solutions and the like. Consequently, contrary to conventional wet chemical etch strategies based on diluted SPM, as discussed above, the degree of undercutting of the semiconductor-based electrode material is highly predictable, thereby substantially not contributing to any non-uniformities with respect to the finally obtained effective electrical gate length when starting from a well-defined gate length obtained after the patterning of the gate layer stack on the basis of well-established reactive ion etch techniques. Due to the substantially self-limiting behavior, or due to at least a significantly reduced etch rate in the undercut area after the application of a plurality of alternating process steps, any pronounced "footing effects" upon patterning the gate layer stack may also be removed, which may conventionally typically result in inferior encapsulation of the sensitive gate electrode materials. Consequently, the electrically effective gate length may be adjusted in a highly controllable and predictable manner upon forming the undercut area, which in turn provides an increased layer thickness of a liner material to be provided so as to protect any sensitive gate materials, thereby substantially preserving the previously adjusted geometric configuration of the bottom area of the sophisticated gate electrode structure and also substantially preserving the electronic characteristics of the sensitive gate materials, which, as discussed above, strongly influence the transistor characteristics, such as threshold voltage, transconductance and the like.

In other illustrative embodiments disclosed herein, the final etch sequence performed on the basis of a plurality of alternating process steps based on ozone and hydrofluoric acid may comprise additional process steps based on hydrochloric acid, which may lead to superior process results, in particular when the gate dielectric material may comprise metal species, for instance in the form of lanthanum, aluminum and the like, in order to appropriately adjust the work function of the gate electrode materials. In this case, a sequence of an ozone-based step, a hydrofluoric acid-based step and a hydrochloric acid-based process step may be repeatedly performed with intermediate water-based rinse steps, wherein the hydrochloric acid may efficiently remove the additional work function metal species so that also a highly controllable and predictable degree of under etching may be achieved.

Figure 1A:
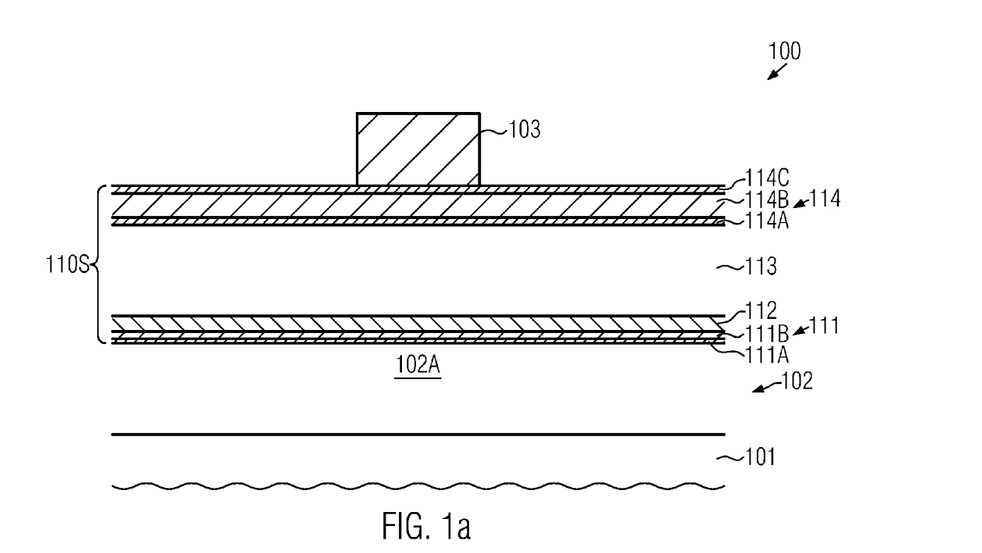
FIGS. 1a-1d schematically illustrate cross-sectional views of a semiconductor device during various manufacturing stages in forming a gate electrode structure comprising a high-k dielectric material and a metal-containing electrode material, according to illustrative embodiments.

FIG. 1a schematically illustrates a semiconductor device 100 in an early manufacturing stage when forming a complex gate electrode structure. As shown, the semiconductor device 100 may comprise a substrate 101, such as a semiconductor substrate and the like, above which is formed a semiconductor layer 102, for instance in the form of a silicon-based material, a silicon/germanium material and the like. The semiconductor layer 102 and the substrate 101 may form a silicon-on-insulator (SOI) configuration when a buried insulating material (not shown) is formed below the semiconductor layer 102 so as to vertically isolate the layer 102 from any conductive material of the substrate 101. In other cases, a bulk configuration may be applied when the semiconductor layer 102 may directly connect to a crystalline material of the substrate 101. It should be appreciated that the semiconductor layer 102 may have any appropriate composition and thickness in order to form therein and thereabove appropriate semiconductor-based circuit elements, such as transistors and the like. In the embodiment shown, the semiconductor layer 102, or at least a portion thereof, also indicated as semiconductor region or active region 102A, may be appropriately configured so as to enable to form a complex transistor device having a gate electrode structure based on a high-k dielectric material and a metal-containing electrode material, wherein an effective gate length of 50 nm and significantly less has to be implemented. The active region 102A may be laterally delineated by any isolation structures (not shown), such as shallow trench isolations and the like. Furthermore, in the manufacturing stage shown, a gate layer stack 110S may be formed on the semiconductor layer 102, i.e., on the active region 102A, and on any isolation regions, which may be used for delineating the active region 102A. In the embodiment shown, the gate layer stack 110S may comprise a gate insulation layer 111, which may represent any appropriate gate dielectric material that provides a high capacitive coupling while at the same time maintaining any leakage currents at a low level, as is also discussed above. For example, the gate insulation layer 111 may comprise a base material 111A, such as a silicon dioxide material and the like, which may have a thickness of less than 1 nm. Furthermore, a dielectric layer 111B may be provided, for instance, in the form of a so-called high-k dielectric material, for instance comprising appropriate metal oxides and the like. For example, frequently, hafnium oxide may be used, possibly in combination with a nitrogen species and the like. It should be appreciated, however, that any other high-k dielectric material may be used. In some illustrative embodiments, one or both of the layers 111A, 111B may have incorporated therein an appropriate metal species in order to adjust the resulting work function of the gate electrode structure. To this end, specific metal species, such as lanthanum, for instance used for N-channel transistors, and aluminum, for instance for P-channel transistors, may be incorporated, for instance, into the layer 111B.

Furthermore, a metal-containing electrode layer 112 may be formed in close proximity to the gate insulation layer 111 and may, in some illustrative embodiments, be directly formed on the gate insulation layer 111, wherein the layer 112 may provide superior conductivity, for instance, compared to a doped silicon material and which may also provide, still in combination with any metal species incorporated in the layer 111B, an appropriate work function for a transistor under consideration. For example, the layer 112 may be provided in the form of a titanium and nitrogen-based material, which may also be referred to as titanium nitride, which may include additional species, such as other metal species, silicon, nitrogen and the like, depending on the overall device requirements. Due to superior high temperature characteristics, frequently titanium nitride may be used as the layer 112. Thereafter, a semiconductor-based electrode material 113, such as an amorphous silicon material, a polysilicon material or a combination thereof, may be provided, while, in other cases, other semiconductor-based material, such as a silicon/germanium mixture, a germanium material and the like, may be used.

Next, a dielectric cap layer 114 may be provided, for instance, based on a silicon nitride material and the like. The cap layer 114 may be used as a hard mask material and/or as a cap material during the further processing of the device 100, for instance when superior integrity may be required, for instance in terms of implementing strain-inducing semiconductor materials into the active region 102A and the like. In the embodiment shown, the cap or hard mask layer 114 may comprise several sub-layers, such as layers 114A, 114B, 114C, which may be provided in the form of a silicon dioxide material, for instance, for the layers 114A and 114C, and a silicon nitride material, for instance, for the layer 114B. It should be appreciated, however, that other configurations may be applied as long as these material compositions are compatible with the patterning of the layer stack 110S and the subsequent processing. Furthermore, an etch mask 103 is formed above the layer stack 110S so as to define the lateral position and size of a gate electrode structure to be formed from the gate layer stack 110S.

The semiconductor device 100 as shown in FIG. 1a may be formed on the basis of the following processes. The active region 102A may be formed by fabricating any isolation regions in the semiconductor layer 102 on the basis of well-established process techniques. In some cases, prior to or after forming the corresponding isolation structures, an additional semiconductor material may have to be formed in an upper portion of the active region 102A, for instance in the form of a silicon/germanium mixture and the like (not shown), in order to provide a desired band gap offset, if required. Next, the gate insulation layer 111 may be formed, for instance, by forming the layer 111A, if required, which may be accomplished on the basis of sophisticated oxidation techniques, deposition and the like, in order to provide the layer 111A with a thickness of, for instance, less than 10 Å, with a desired uniformity in thickness and material composition. Next, the layer 111B may be deposited, for instance, by atomic layer deposition (ALD), chemical vapor deposition (CVD) and the like, based on well-established process techniques. As discussed above, in some cases, specific metal species may have to be incorporated into the gate insulation layer 111 in order to obtain a desired work function and to provide a substantially identical gate layer stack for N-channel transistors and P-channel transistors, respectively. To this end, appropriate metal layers, such as lanthanum, aluminum and the like, may be deposited, possibly followed by a cap material, such as titanium nitride, followed by any heat treatments so as to appropriately diffuse the corresponding metal species into the gate insulation layer 111. Thereafter, the material layers, such as the cap layer and the actual diffusion layer, may be removed and the electrode material 112 may be provided for any type of transistors. In other cases, additional metal layers may be provided so as to adjust the desired threshold voltage. Next, the semiconductor material 113 may be provided on the basis of well-established deposition techniques, followed by the deposition of the cap layer 114. Thereafter, the etch mask 103 may be provided, for instance, in the form of a resist material and respective lithography and trim etch processes may have to be applied so as to provide the mask 103. Thereafter, the dielectric cap layer 114 may be patterned on the basis of the mask 103, wherein the patterning of the layer 114 may comprise two lithography steps in some sophisticated approaches.

Figure 1B:
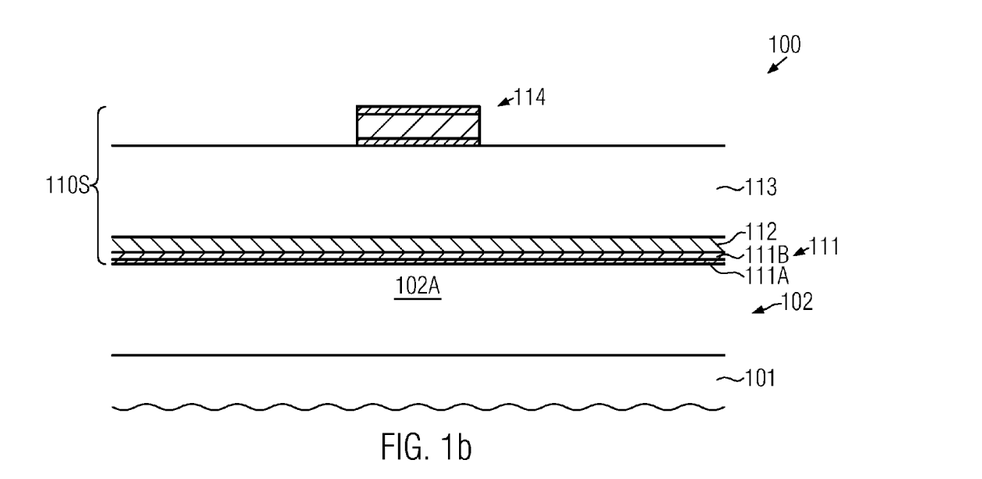

FIG. 1b schematically illustrates the semiconductor device 100 after the patterning of the cap layer 114, which may now be used as a hard mask material for patterning the remaining portion of the gate layer stack 110S. It should be appreciated that the cap layer 114 may have a target gate length which may be transferred into the material 113, possibly with a certain degree of tapering, if desired, while the final length of the layer stack 110S and, in particular, the final electrically effective gate length may be adjusted in a later manufacturing stage.

Figure 1C:
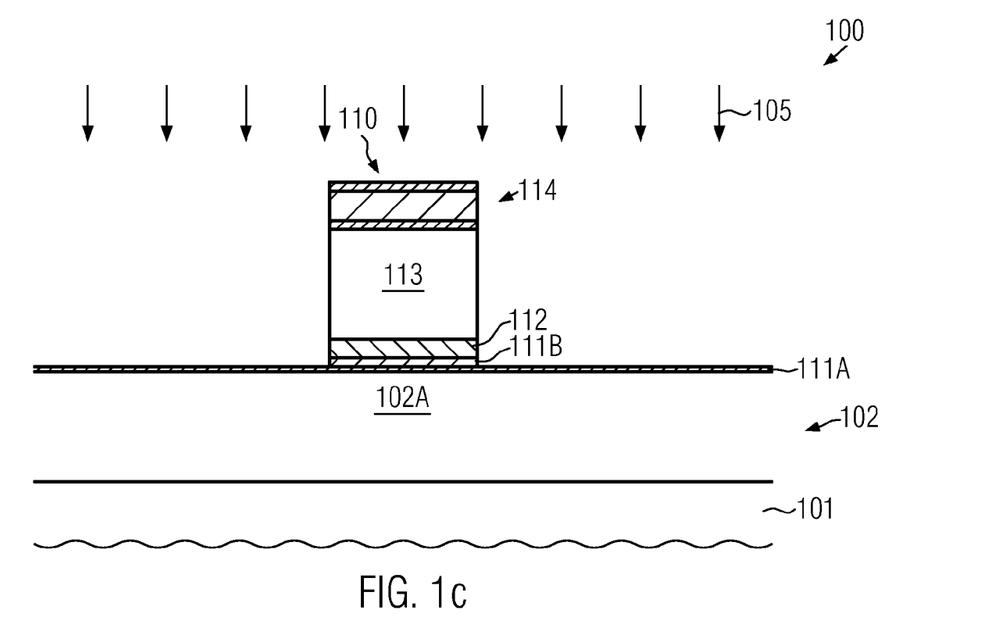

FIG. 1c schematically illustrates the semiconductor device 100 in a further advanced manufacturing stage when an etch sequence 105 may be applied so as to form a gate electrode structure 110. The etch sequence 105 may typically be performed as a plasma-based etch process with a pronounced anisotropic behavior, which may also be referred to as a reactive ion etching process. On the basis of well-established selective etch recipes, it may be etched through the material 113 and also through the material layers 112 and 111B, while the base layer 111A may act as an efficient etch stop material. As is well known, during an anisotropic etch process, the degree of the lateral etch rate may be adjusted, for instance, by applying specific polymer components to the etch ambient and the like. Thus, the cross-sectional shape of the gate electrode structure 110 may be adjusted as considered appropriate for the further processing and for the final transistor characteristics. For example, if desired, a certain degree of tapering (not shown) may be applied in order to obtain a greater gate length at the bottom of the gate electrode structure 110.

Figure 1D:
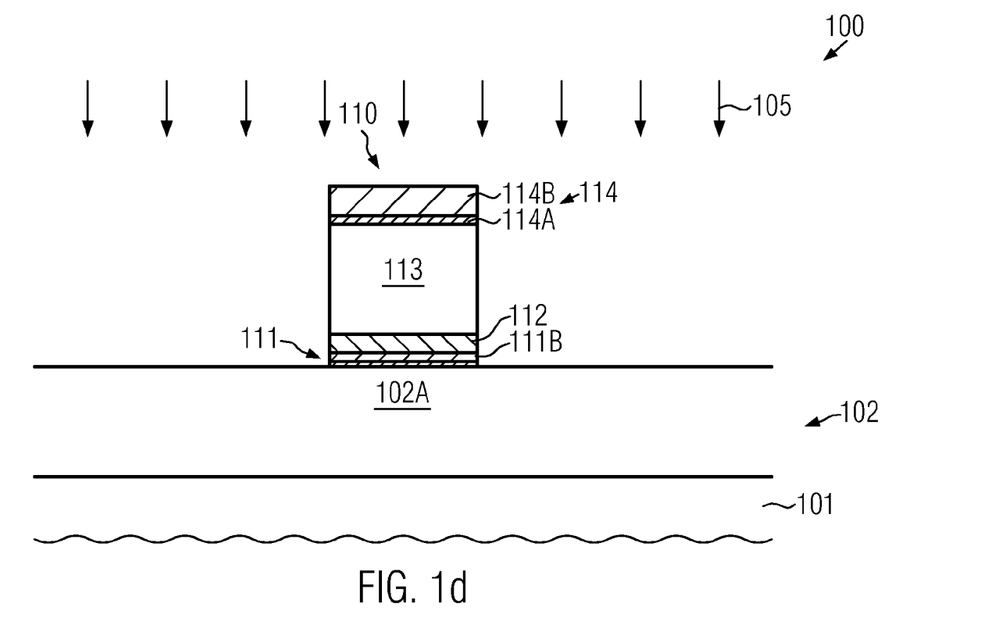

FIG. 1d schematically illustrates the semiconductor device 100 during a final stage of the etch sequence 105, thereby removing exposed portions of the base layer 111A and also any exposed oxide material of the cap layer 114. It should be appreciated, however, that, in other process strategies, the base material 111A may be patterned during the subsequent etch sequence, which may also be performed so as to provide an undercut area below the semiconductor electrode material 113.

Figure 1E:
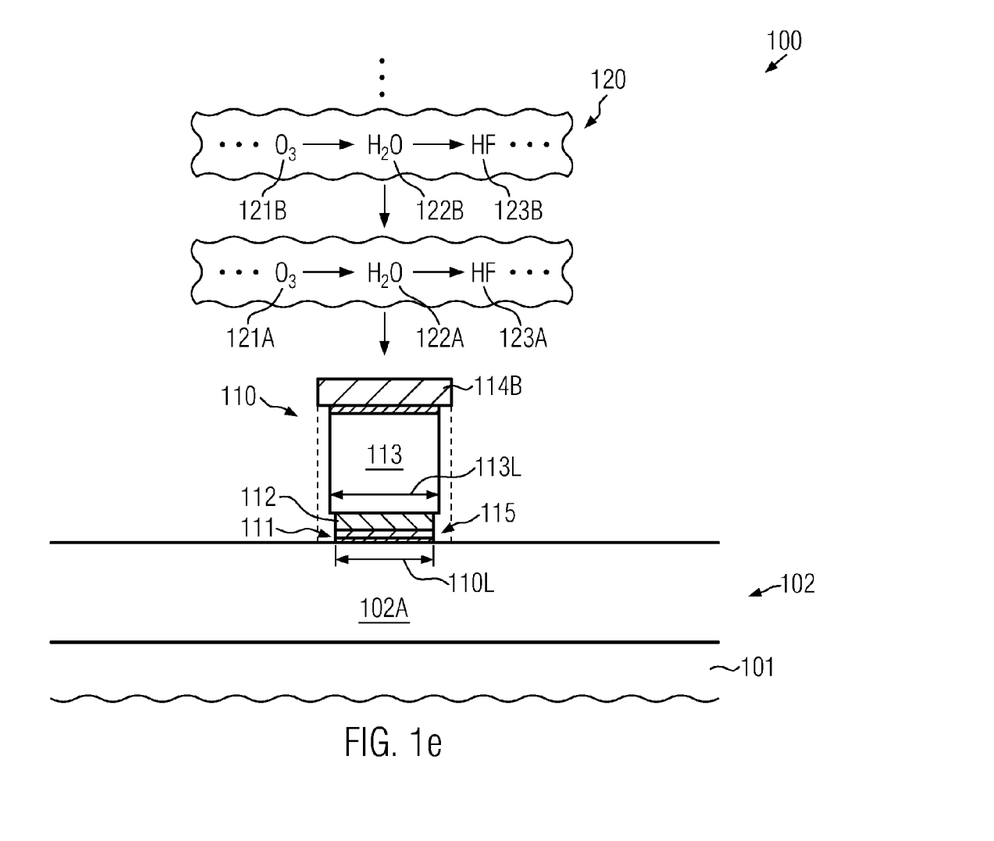
FIG. 1e schematically illustrates the semiconductor device in a further advanced manufacturing stage in which an etch sequence may be applied so as to form an undercut area in the gate electrode structure in a highly controllable manner, according to illustrative embodiments.

FIG. 1e schematically illustrates the semiconductor device 100 when exposed to a further etch sequence 120, which may be applied in the form of a wet chemical process sequence. As illustrated, the etch sequence 120, which may also result in superior cleaning of the device 100 after the basic gate patterning process, may comprise a plurality of first etch or process steps 123A, 123B, ..., which may be performed on the basis of hydrofluoric acid (HF). Furthermore, the sequence 120 may comprise a plurality of second process steps 121A, 121B, ..., which are performed on the basis of an ozone solution, wherein the process steps 121A, 121B and the steps 123A, 123B may be performed in an alternating manner, which may result in a highly controllable or even in a substantially self-limiting removal behavior. In some illustrative embodiments, an efficient separation of the corresponding process steps 121A, 123A, 121B, 123B may be achieved by inserting an intermediate rinse step 122A, 122B, ..., thereby achieving superior process robustness in terms of process time variations, variations in concentration of the solutions used in the steps 121A, 121B, 123A, 123B and the like.

In some illustrative embodiments, a total time budget for the HF chemistry may be determined in advance for a given concentration of the HF solution used in the process steps 123A, 123B, .... That is, generally for a given concentration, for instance for a concentration of 1:250-1:350 of the diluted hydrofluoric acid, a specific accumulated process time may be determined, which is considered acceptable for exposing the device 100 to the reactive chemical solution. Based on the time budget, appropriate process times may be defined for each of the steps 123A, 123B, ..., without exceeding the predetermined time budget. For example, in some illustrative embodiments, at least three HF-based process steps 123A, 123B, ... may be applied and, thus, the total time budget may be divided by three in order to determine the individual process time for each of the steps 123A, 123B, .... It should be appreciated, however, that, as discussed above, certain variations in process time may not negatively affect the process result, i.e., a certain variation of the process time may not result in a variation of the size of a corresponding undercut area 115 formed below the semiconductor-based electrode material 113. For example, for a total time budget of approximately 100 seconds, three or more steps 123A, 123B, ... may be performed with a process time of approximately 30-35 seconds for three process steps or 22-27 seconds for four process steps and the like, wherein, generally, the total time budget may not be exceeded by approximately five percent. The superior robustness with respect to, for instance, process time variations of the steps 123A, 123B, ... may be accomplished by using the intermediate rinse steps based on de-ionized water 122A, 122B, ..., which may be performed for a time interval of approximately ninety seconds and significantly longer, wherein any appropriate rinse time may be readily determined on the basis of experiments. Similarly, the ozone steps 121A, 121B, ... may typically be performed with a process time that is longer compared to the process time of the actual etch steps 123A, 123B, ..., wherein, in some illustrative embodiments, a time interval of approximately one hundred seconds to several hundred seconds may be applied.

Consequently, during the etch sequence 120, the undercut area 115 may be produced by efficiently removing the gate dielectric material 111 and in particular the metal-containing electrode material 112, wherein, for a predefined time budget of the etch steps 123A, 123B, ... a highly predictable degree of under etching may be obtained due to the alternating sequence of the ozone-based steps 121A, 121B, ... and the etch steps 123A, 123B, ... with a pronounced robustness in terms of process time variations or variations of other process parameters during the individual process steps. Consequently, by means of the etch sequence 120, an electrically effective gate length 110L, i.e., in FIG. 1e, the horizontal extension of the metal-containing electrode material 112, may be determined in a highly predictable and uniform manner, while also the final length 113L of the semiconductor-based electrode material 113 may be adjusted since a certain degree of material removal may also occur for this material during the sequence 120. It should be appreciated, however, that the removal rate for the material 113 is less compared to the removal rate for the material 112 and the material 111, thereby obtaining the desired under etched configuration in the form of the undercut area 115. Due to superior process robustness with respect to any variations of process parameters, also the length 113L, starting from the basic gate length as defined by the cap material 114B, may be adjusted with superior uniformity so that any well-established control strategies for adjusting the gate length, which may substantially rely on the control of the process parameters of the etch process 105 (FIG. 1c) may still be efficiently applied, since the material removal in the etch process 120 is predictable and highly uniform.

Figure 1F:
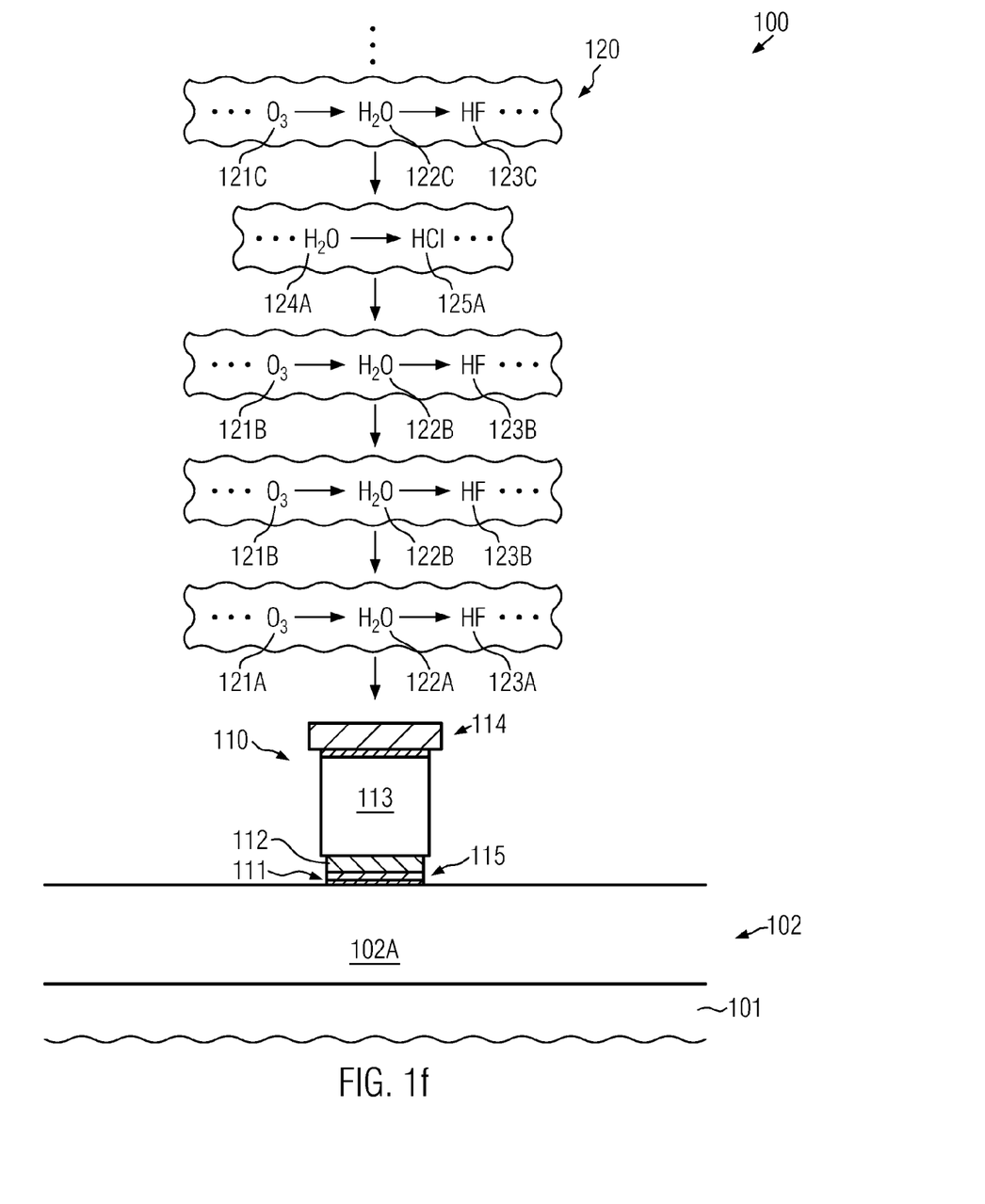
FIG. 1f schematically illustrates the semiconductor device according to still further illustrative embodiments in which the etch sequence for forming the undercut area of the gate electrode structure may comprise an additional type of process step based on hydrochloric acid in order to provide superior efficiency, for instance, for removing work function adjusting metal species.

FIG. 1f schematically illustrates the semiconductor device 100 according to further illustrative embodiments. As illustrated, the etch sequence 120 may comprise a plurality of ozone-based process steps 121A, 121B, 121C, . . . and a plurality of hydrofluoric acid-based process steps 123A, 123B, 123C, . . . , possibly in combination with the respective intermediate water rinse steps 122A, 122B, 122C and the like. Furthermore, additional process steps 125A, . . . may be inserted in order to further enhance process uniformity. For example, the additional process steps 125A, . . . may be inserted between any alternating process steps performed on the basis of ozone, such as the process steps 121A, 121B, 121C and the hydrofluoric acid-based process steps 123A, 123B, 12Cc, wherein, in some illustrative embodiments, the process steps 125A may be performed on the basis of hydrochloric acid (HCl), possibly in combination with a corresponding rinse step 124A, for instance by using de-ionized water. For example, hydrochloric acid with a concentration of, e.g., 1:80 to 1:120 may be used so as to particularly remove any metal species which may be contained in the dielectric material, for instance in the form of lanthanum, aluminum and the like, as is also previously discussed. Thus, in some illustrative embodiments, a typical part of the etch sequence 120 may comprise the following sub-sequence of process steps, for instance starting with one of the ozone-based process steps followed by a rinse process using de-ionized water, followed by an etch step using hydrofluoric acid, followed by a further rinse step with de-ionized water, followed by a hydrochloric acid step followed by a further rinse step on the basis of de-ionized water. Thereafter, this sub-sequence may be repeated a least once, while in other illustrative embodiments this sub-sequence may be repeated at least twice in order to appropriately provide the undercut area 115. Consequently, during the etch step 120, any previously generated patterning-related contaminants and residues may be efficiently removed, while at the same time the undercut configuration of the gate electrode structure 110 may be provided with superior uniformity due to the superior process robustness of the sequence 120.

Figure 1G:
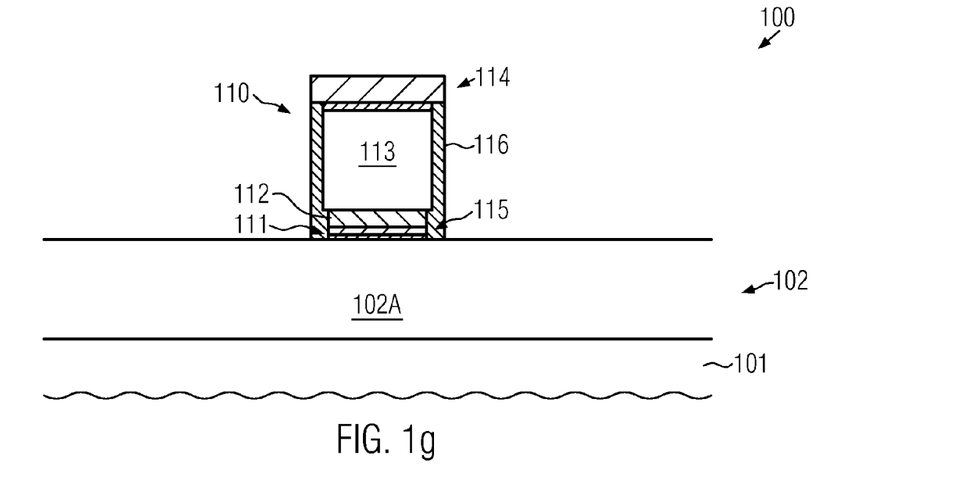
FIG. 1g schematically illustrates the gate electrode structure in a further advanced manufacturing stage in which superior encapsulation of sensitive gate materials may be accomplished on the basis of the undercut areas and a protective liner material, according to illustrative embodiments.

FIG. 1g schematically illustrates the semiconductor device 100 in a further advanced manufacturing stage. As illustrated, a protective liner or sidewall spacer 116 may be provided on exposed sidewall surface areas of the gate electrode structure 110 and may, in particular, be formed within the undercut area 115. As previously discussed, an increased amount of the liner material, for instance provided in the form of a silicon nitride material, may be deposited in the undercut area 115, or at least any material formed therein may be less exposed to any subsequent patterning processes, thereby ensuring superior encapsulation of the sensitive materials 112 and 111. Consequently, the previously adjusted electrically effective gate length 110L (FIG. 1e) may be efficiently "conserved" upon providing the liner material 116 having the superior encapsulating effect in the undercut area 115, thereby also contributing to a reduced probability of exposing any minute sidewall surface areas of the sensitive materials 111 and 112 to any reactive process ambient during the further processing. For example, as explained above, during the further processing, frequently efficient cleaning recipes may have to be applied, for instance based on SPM and the like, which may, however, substantially not negatively affect the electronic characteristics of the gate electrode structure 110 due to the superior confinement accomplished on the basis of the undercut area 115 and the liner material 116. The liner material 116 may be formed on the basis of any well-established deposition techniques, such as LPCVD, multi-layer deposition CVD, or any combination thereof, in which an appropriate protective material, such as silicon nitride, may be applied. If desired, the liner material may be patterned so as to form a spacer structure, as shown in FIG. 1g, prior to performing any other processes, such as the incorporation of drain and source dopant species and the like. In other cases, the liner material may be preserved upon incorporating drain and source dopant species and may be patterned in a later manufacturing stage.

Figure 1H:
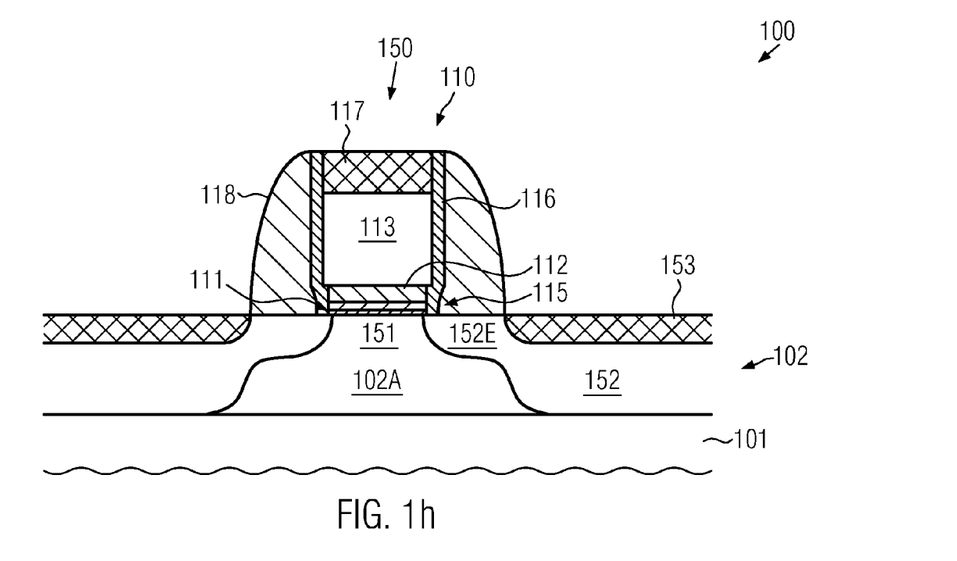
FIG. 1h schematically illustrates a transistor device comprising the sophisticated high-k metal gate electrode structure that provides superior transistor characteristics, according to illustrative embodiments.

FIG. 1h schematically illustrates the semiconductor device 100 in a further advanced manufacturing stage. As shown, a transistor 150 may be formed in and above the active region 102A and may comprise drain and source regions 152, which may include corresponding drain and source extension regions 152E, depending on the required vertical and lateral dopant profile. Thus, the drain and source regions 152 may laterally enclose a channel region 151, the conductivity of which may be controlled by the gate electrode structure 110 having the electrically effective gate length 110L (FIG. 1e). On the other hand, the semiconductor-based electrode material 113 may have a greater length, as is also discussed above with reference to FIG. 1e. Furthermore, in the manufacturing stage shown, metal silicide regions 153 may be provided within the drain and source regions 152 and similarly a metal silicide portion 117 may be provided in the gate electrode structure 110, while in other cases (not shown) the cap layer 114 (FIG. 1g) may still be formed above the semiconductor-based electrode material 113. Furthermore, a sidewall spacer structure 118 having any desired configuration may be provided on sidewalls of the gate electrode structure 110, i.e., on the protective liner material 116. The transistor 150 may be formed on the basis of any appropriate process strategy based on the gate electrode structure 110 as shown in FIG. 1g. For example, any appropriate spacer element may be formed in order to define the lateral offset of the drain and source extension regions 152E, while in other cases the liner 116 may be used as an efficient offset spacer material for the corresponding implantation process. It should be appreciated that the undercut area 115 and the superior encapsulation by the liner 116 achieved therein may also provide superior integrity of the sensitive gate materials 111 and 112 upon performing any implantation steps including a tilt angle, which may frequently be applied when incorporating dopant species for defining counter-doped areas with respect to the drain and source regions 152 and the like. Thereafter, the spacer structure 118 may be formed or may be completed on the basis of any appropriate process technique, followed by further implantation processes in order to introduce further drain and source dopant species. Thereafter, any high temperature processes may be applied in order to define the final dopant profile of the drain and source regions 152. Thereafter, the metal silicide regions 153 may be formed on the basis of any appropriate silicidation technique. If desired, at any appropriate manufacturing stage, the cap layer 114 (FIG. 1g) may be removed and the metal silicide 117 may be formed together with the metal silicide 153. In other cases, at least the metal silicide 117 may not be formed in this manufacturing stage, for instance when at least the material 113 is to be replaced by an electrode material of superior conductivity, such as aluminum and the like, which may be accomplished by providing any sacrificial or permanent dielectric material for laterally embedding the gate electrode structure 110 and subsequently performing a selective etch process for removing the material 113. Thereafter, any appropriate electrode metal may be filled in and any excess material thereof may be removed, for instance, by chemical mechanical polishing (CMP) and the like.

In other illustrative embodiments (not shown), starting with the configuration as shown in FIG. 1g, a strain-inducing semiconductor material may be incorporated into the active region 102A, for instance by forming corresponding cavities and refilling the cavities with an appropriate strain-inducing semiconductor material, such as silicon/germanium, silicon carbon and the like. Also in this case, the undercut area 115 may provide superior confinement of the sensitive materials 111, 112, thereby also providing superior process robustness.

As a result, the present disclosure provides semiconductor devices and manufacturing techniques in which sophisticated high-k metal gate electrode structures may be provided with a very uniform undercut configuration in which the electrically effective gate length may be less than the gate length of a semiconductor-based electrode material or of a highly conductive electrode metal. The undercut configuration may be obtained on the basis of a very robust and thus uniform etch sequence including at least a plurality of alternating ozone-based and hydrofluoric acid-based process steps. Consequently, starting from a well-defined electrode configuration obtained after a first process sequence for patterning the gate layer stack on the basis of plasma assisted anisotropic etch techniques, the final adjustment of the electrically effective gate length and of the length of a further electrode material, for instance in the form of polysilicon or a highly conductive gate metal, may be adjusted during the further subsequent etch sequence including the alternating process steps. The well-predictable and highly uniform electrically effective gate length may then be preserved with superior robustness during the further processing of the semiconductor device by forming an appropriate liner material, which may result in superior integrity of the sensitive gate materials in the undercut area. In this manner, variability of transistor characteristics, such as threshold voltage, transconductance and the like, may be improved within single semiconductor die regions and also within entire substrates since the actual process for adjusting the electrically effective gate length and for preserving the same is achieved on the basis of the wet chemical etch sequence having the superior process uniformity and robustness. For example, a plurality of electrical measurement data seem to confirm that a significant improvement with respect to uniformity of transistor characteristics may be obtained upon applying the undercut gate configuration obtained on the basis of the "toggling" of ozone-based process steps and HF-based process steps. Consequently, sophisticated gate electrode structures may be provided for transistors of advanced semiconductor devices wherein the basic gate characteristics, such as work function, capacitive coupling, electrically effective gate length and the like, may be adjusted in an early manufacturing stage with superior overall across-substrate and across-die uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a gate electrode structure of a semiconductor device, the method comprising:
performing a first etch sequence so as to pattern a gate layer stack formed above a substrate, said gate layer stack comprising a gate dielectric layer including a high-k dielectric material, a metal-containing electrode material formed above said gate dielectric layer and a semiconductor material formed above said metal-containing electrode material;
performing a second etch sequence so as to form an undercut area in said patterned gate layer stack below said semiconductor material, wherein performing said second etch sequence comprises:
performing a first hydrofluoric acid-based etch step;
performing a first ozone-based process step following said first hydrofluoric acid-based etch step; and
performing a second hydrofluoric acid-based etch step following said first ozone-based process step; and
forming a protective liner on exposed surface areas of at least said undercut area.

2. The method of claim 1, wherein performing said second etch sequence further comprises performing a second ozone-based process step following said second hydrofluoric acid-based etch step and performing a third etch step following said second ozone-based process step.

3. The method of claim 1, wherein performing said second etch sequence further comprises performing at least one hydrochloric acid-based etch step.

4. The method of claim 1, wherein performing said second etch sequence further comprises exposing said semiconductor device to hydrofluoric acid for a total process time of approximately 150 seconds or less.

5. The method of claim 4, wherein a process time of each of said first hydrofluoric acid-based etch step and said second hydrofluoric acid-based etch step is approximately 50 seconds or less.

6. The method of claim 5, wherein a process time of said first ozone-based process step is greater than the process time of each of said first hydrofluoric acid-based etch step and said second hydrofluoric acid-based etch step.

7. The method of claim 1, wherein performing said second etch sequence further comprises performing a rinse step based on deionized water prior to each of said first hydrofluoric acid-based etch step and said second hydrofluoric acid-based etch step.

8. The method of claim 7, wherein a duration of said rinse step is selected to be approximately 100 seconds or more.

9. The method of claim 1, wherein said metal-containing electrode material comprises titanium and nitrogen.

10. The method of claim 3, wherein said high-k dielectric material comprises a metal oxide base material and a metal species for adjusting a work function of said gate electrode structure.

11. A method, comprising:
forming a gate electrode structure on a semiconductor region of a semiconductor device, said gate electrode structure comprising a semiconductor material and a gate insulation layer formed below said semiconductor material, said gate insulation layer comprising a high-k dielectric material; and
reducing a length of said gate insulation layer relative to said semiconductor material by performing a wet chemical process sequence, wherein performing said wet chemical process sequence comprises performing a plurality of alternating process steps, each of said plurality of alternating process steps comprising a first process step performed on the basis of hydrofluoric acid of followed by a second process step performed on the basis of ozone.

12. The method of claim 11, wherein performing said wet chemical process sequence further comprises a plurality of third process steps performed on the basis of hydrochloric acid.

13. The method of claim 11, wherein performing each of said plurality of alternating process steps further comprises rinsing said gate electrode structure after performing each of said first process step and said second process step.

14. The method of claim 11, wherein said plurality of alternating process steps comprises at least three alternating process steps.

15. The method of claim 11, further comprising determining a time budget for exposing said gate electrode structure to hydrofluoric acid and determining a process time of each of said plurality of first process steps by dividing said time budget.

16. The method of claim 15, wherein a process time of each of said first process steps is shorter than a process time of each of said second process steps.

17. The method of claim 12, wherein said gate insulation layer comprises one of lanthanum and aluminum.

18. The method of claim 11, further comprising forming a protective liner on exposed sidewall areas of said gate electrode structure after reducing said length of said gate insulation layer.

* * * * *